US010735000B1

(12) United States Patent
Tran et al.

(10) Patent No.: US 10,735,000 B1
(45) Date of Patent: Aug. 4, 2020

(54) PRE-DRIVER CIRCUITS FOR AN OUTPUT DRIVER

(71) Applicant: GLOBALFOUNDRIES INC., Grand Cayman (KY)

(72) Inventors: Dzung T. Tran, Austin, TX (US); Sushama Davar, Leander, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/720,181

(22) Filed: Dec. 19, 2019

(51) Int. Cl.
*H03K 19/017* (2006.01)
*H03K 19/003* (2006.01)

(52) U.S. Cl.
CPC . *H03K 19/01721* (2013.01); *H03K 19/00323* (2013.01); *H03K 19/00384* (2013.01)

(58) Field of Classification Search
None
See application file for complete search history.

(56) References Cited

U.S. PATENT DOCUMENTS

| | | |
|---|---|---|
| 4,789,796 A | 12/1988 | Foss |
| 5,039,893 A | 8/1991 | Tomisawa |
| 5,122,690 A | 6/1992 | Bianchi |
| 5,537,070 A | 7/1996 | Risinger |
| 6,225,844 B1* | 5/2001 | Fujiwara .......... H03K 19/00361 327/108 |
| 6,720,805 B1 | 4/2004 | Haas |
| 6,924,669 B2 | 8/2005 | Itoh et al. |
| 7,245,156 B2 | 7/2007 | Yeung et al. |
| 7,737,728 B1 | 6/2010 | Truong et al. |
| 8,816,727 B2 | 8/2014 | Hoogendoorn |
| 9,344,088 B1* | 5/2016 | Sanchez ......... H03K 19/018521 |
| 9,438,236 B2 | 9/2016 | Priel et al. |
| 2010/0253391 A1* | 10/2010 | Truong .................. H03K 5/133 327/108 |
| 2013/0257490 A1* | 10/2013 | Kanayama ..... H03K 19/018571 327/109 |
| 2017/0214403 A1* | 7/2017 | Arai ................... H03K 19/0016 |

* cited by examiner

Primary Examiner — Jany Richardson
(74) Attorney, Agent, or Firm — Gibb & Riley, LLC; David A. Cain, Esq.

(57) ABSTRACT

A disclosed pre-driver includes multiple signal generation stages and a switching bias circuit with a first switch and a second switch. The first switch and primary inverters in each of the stages all receive the same input signal. When the input signal transitions, the first switch turns on the bias circuit to supply a bias voltage to each of the stages. However, the primary inverters do not concurrently turn on. Instead, due to the bias voltage and some additional circuitry within each stage, the primary inverters turn on in sequence and slowly, thereby ensuring that pre-driver signals generated and output by the different stages, respectively, transition in sequence and at a relatively slow rate. Once the last pre-driver signal transitions, the second switch turns off the switching bias circuit. Optionally, a selected one of multiple bias voltages could be used in order to tune delay and transition times.

20 Claims, 6 Drawing Sheets

PRE-DRIVER CIRCUITS FOR AN OUTPUT DRIVER

BACKGROUND

Field of the Invention

The present invention relates to output drivers and, more particularly, to pre-driver circuits that can be incorporated into an output driver.

Description of Related Art

Generally, an output driver receives a data out signal and, based on the data out signal, produces an amplified data out signal on an output pad. Specifically, the output driver includes a pull-up path and a pull-down path and these two paths are selectively and alternatively turned on to either pull-up the voltage level on the output pad or pull-down the voltage level on the output pad, respectively, in response to switching of the data output signal. The pull-up and the pull-down paths each include a level shifter that increases the data signal level (e.g., from 0.8V to 1.8V) to produce an up-shifted signal. The pull-up and the pull-down paths each further include a pre-driver. For the pull-up path, the pre-driver can receive the up-shifted signal and, using the up-shifted signal, can produce and output multiple different pull-up pre-driver signals (e.g., three pull-up pre-driver signals including one inverted signal and two different delayed inverted signals). For the pull-down path, the pre-driver can similarly receive the up-shifted signal and, using the up-shifted signal, can produce and output multiple different pull-down pre-driver signals (e.g., three pull-down pre-driver signals including one inverted signal and two different delayed inverted signals). The pull-up and the pull-down paths can each further include a main driver with multiple (e.g., three) driver stages. For the pull-up path, the stages of the main driver can receive the different pull-up pre-driver signals, respectively, turning on sequentially due to the delay in order to reduce switching noise and add adjustable output slew-rate to the amplified data out signal at the output pad. Similarly, for the pull-down path, the stages of the main driver can receive the different pull-down pre-driver signals, respectively, turning on sequentially due to the delay in order to reduce switching noise and add adjustable output slew-rate to the amplified data output signal at the output pad.

Historically, in each pre-driver, the multiple different pre-driver signals (e.g., including an inverted signal and two different delayed inverted signals) are generated using field effect transistors (FETs) with different gate lengths and thereby different channel lengths to add the different delays. That is, the different pre-driver signals are generated through the use of FETs having different channel lengths, where the FETs with the longer channel lengths are used to achieve longer delays. Unfortunately, in advanced technology nodes (e.g., at the 12 nm fin-type field effect transistor (FinFET) technology node and beyond) there are process limitations that make increasing channel lengths difficult. To avoid using FETs having different channel lengths in the pre-drivers, designers at these advanced technology nodes currently use inverter chains with taps along with remote voltage generators for the power supply that controls the inverter chain. However, this solution is costly in terms of both area consumption and power consumption. Furthermore, the amount of delay provided by the inverter chain is typically not tunable (e.g., to account for process variation).

SUMMARY

Disclosed herein are embodiments of a pre-driver (e.g., either a pull-up pre-driver or a pull-down pre-driver) for an output driver. The pre-driver can include multiple signal generation stages (i.e., two or more stages) including at least a first stage and a last stage for generating and outputting different pre-driver signals, respectively. The pre-driver can also include a local switching bias circuit, which includes a bias voltage node that is electrically connected to each of the stages and which also includes on/off switches (i.e., a first switch and a second switch) that are controlled as discussed below so that the switching bias circuit is only turned on when needed.

During normal operation, the first switch and each of the stages can receive an input signal. In response to this input signal transitioning from a first voltage level to a second voltage level, the first switch can turn on the switching bias circuit in order to supply a bias voltage to each of the stages and the stages can generate and output the pre-driver signals. The pre-driver signals can be inverted with respect to the input signal and can have a longer slew-rate. Furthermore, at least the pre-driver signals from the second and last stages can be delayed. More specifically, due to the bias voltage and further due to specific circuitry within each stage (discussed in greater detail below), the stages can generate and output the pre-driver signals such that the pre-driver signals are inverted with respect to the input signal, such that transitioning of the pre-driver signals (e.g., from the second voltage level to the first voltage level) occurs in sequence (i.e., with a first signal from the first stage transitioning first and a last signal from the last stage transitioning last), and further such that this transitioning occurs at a slower rate than transitioning of the input signal. The second switch in the switching bias circuit can be controlled by the last pre-driver signal in a feedback loop. That is, the second switch can receive the last pre-driver signal output from the last stage and, when the last pre-driver signal transitions from the second voltage level back to the first voltage level, the second switch can turn off the switching bias circuit.

Depending upon whether the pre-driver is a pull-up pre-driver for the pull-up path of an output driver or a pull-down pre-driver of the pull-down path of the output driver, specific features of the circuit will vary.

For example, in one exemplary embodiment, a pull-up pre-driver for the pull-up path of an output driver can include multiple signal generation stages including a first stage; a second stage; and a last stage for generating and outputting different pull-up pre-driver signals, respectively. The pull-up pre-driver can further include a local switching bias circuit, which includes a bias voltage node that is electrically connected to each of the stages and which also includes on/off switches (i.e., a first switch and a second switch) that are controlled as discussed below so that the switching bias circuit is only turned on when needed. This switching bias circuit can specifically include a group of n-type field effect transistors (NFETs) connected in series between a positive voltage rail (e.g., at VDD) and a ground rail (or negative voltage rail) (e.g., at VSS) and at least one bias voltage node at a junction between adjacent NFETs in the group such that the level of a bias voltage on the bias voltage node, when the switching bias circuit is turned on, is at some specific bias voltage level within a range from approximately one-half VDD to VDD. Two of the NFETs in the group can be configured as the on/off switches (i.e., a first switch and a second switch). All of the others NFETs in the group can be diode-connected transistors. Those skilled in the art will recognize that a diode-connected transistor is a field effect transistor whose gate and drain region are shorted together, thereby forming a resistor.

During normal operation of the pull-up pre-driver, the first NFET switch and each of the stages can receive an input signal. In response to this input signal transitioning from a low voltage level to a high voltage level, the first NFET switch can turn on the switching bias circuit in order to supply the bias voltage to each of the stages and the stages can generate and output the different pull-up pre-driver signals, respectively. The pull-up pre-driver signals can be inverted with respect to the input signal and can have a longer slew-rate. Furthermore, at least the pull-up pre-driver signals from the second and last stages can be delayed. More specifically, due to the bias voltage and further due to specific circuitry within each stage (discussed in greater detail below), the stages can generate and output the different pull-up pre-driver signals, respectively, such that the pull-up pre-driver signals are inverted with respect to the input signal, such that transitioning of the pull-up pre-driver signals from the high voltage level to the low voltage level occurs in sequence (i.e., with a first signal from the first stage transitioning first and a last signal from the last stage transitioning last), and further such that this transitioning occurs at a slower rate than transitioning of the input signal. Additionally, the second NFET switch in the switching bias circuit can be controlled by the last pull-up pre-driver signal in a feedback loop. That is, the second NFET switch can receive the last pull-up pre-driver signal and, when the last pull-up pre-driver signal transitions back down to the low voltage level, the second NFET switch can turn off the switching bias circuit.

In another exemplary embodiment, a pull-down pre-driver for the pull-down path of an output driver can include multiple signal generation stages including: a first stage; a second stage; and a last stage for generating and outputting different pull-down pre-driver signals, respectively. The pull-down pre-driver can further include a local switching bias circuit, which includes a bias voltage node that is electrically connected to each of the stages and which also includes on/off switches (i.e., a first switch and a second switch) that are controlled as discussed below so that the switching bias circuit is only turned on when needed. This switching bias circuit can specifically include a group of p-type field effect transistors (PFETs) connected in series between a positive voltage rail (e.g., at VDD) and a ground rail (or negative voltage rail) (e.g., at VSS) and at least one bias voltage node at a junction between adjacent PFETs in the group such that the level of a bias voltage on the bias voltage node, when the switching bias circuit is turned on, is at some specific bias voltage level within a range, for example, from approximately one-half VDD and VSS. Two of the PFETs in the group can be configured as the on/off switches (i.e., a first switch and a second switch). All of the others PFETs in the group can be diode-connected transistors. Those skilled in the art will recognize that a diode-connected transistor is a field effect transistor whose gate and drain region are shorted together, thereby forming a resistor.

During normal operation of this pull-down pre-driver, the first PFET switch and each of the stages can receive an input signal. In response to this input signal transitioning from a high voltage level to a low voltage level, the first PFET switch can turn on the switching bias circuit in order to supply the bias voltage to each of the stages and the stages can generate and output the different pull-down pre-driver signals, respectively. The pull-down pre-driver signals can be inverted with respect to the input signal and can have a longer slew-rate. Furthermore, at least the pull-down pre-driver signals from the second and last stages can be delayed. More specifically, due to the bias voltage and further due to specific circuitry within each stage (discussed in greater detail below), the stages can generate and output the pull-down pre-driver signals, respectively, such that the pull-down pre-driver signals are inverted with respect to the input signal, such that transitioning of the pull-down pre-driver signals from the low voltage level to the high voltage level occurs in sequence (i.e., with a first pull-down pre-driver signal from the first stage transitioning first and a last pull-down pre-driver signal from the last stage transitioning last) and further such that this transitioning occurs at a slower rate than transitioning of the input signal. Additionally, the second PFET switch in the switching bias circuit can be controlled by the last pull-down pre-driver signal in a feedback loop. That is, the second PFET switch can receive the last delay signal and, when the last delay signal transitions back up to the high voltage level, the second PFET switch can turn off the switching bias circuit.

It should be noted that in each of the embodiments described above a single bias voltage node in the switching bias circuit could be directly electrically connected to each of the stages. Alternatively, the switching bias circuit can include: multiple bias voltage nodes; and a multiplexor, which can selectively electrically connect one of the bias voltage nodes to each the stages in order to tune delay and transition times of the delay signals, as discussed in greater detail below.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
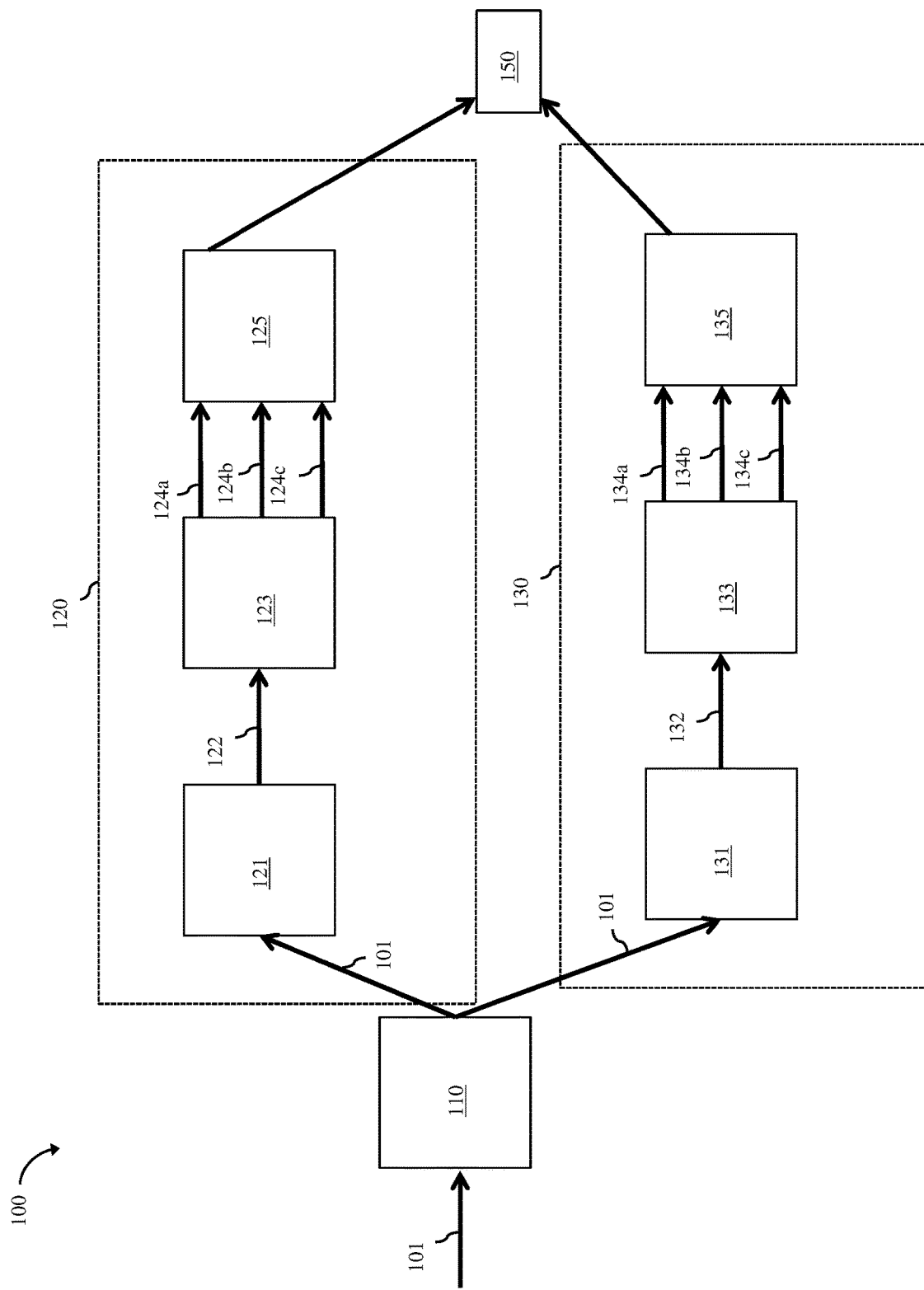
FIG. 1A is a schematic diagram an output driver and the components thereof.

As mentioned above, an output driver receives a data out signal and, based on the data out signal, produces an amplified data out signal on an output pad. FIG. 1A is a schematic drawing of an exemplary output driver 100. In this output driver 100, a received data out signal 101 is selectively passed by control logic 110 to either a pull-up path 120, which is configured to pull-up the voltage level on the output pad 150, or a pull-down path 130, which is configured to pull-down the voltage level on the output pad 150. The pull-up path 120 and the pull-down path 130 each include a level shifter 121, 131 that up-shifts the voltage level on the data output signal 101 (e.g., from 0.8V to 1.8V) in order to produce an up-shifted signal 122, 132. The pull-up path 120 and the pull-down path 130 each further include a pre-driver 123, 133. For the pull-up path, the pre-driver 123 can receive the up-shifted signal 122 and, using the up-shifted signal 122, can produce and output multiple different pull-up pre-driver signals (e.g., three different pull-up pre-driver signals including an inverted signal 124a and two different delayed inverted signals 124b and 124c). For the pull-down path, the pre-driver 133 can receive the up-shifted signal 132 and, using the up-shifted signal 132, can produce and output multiple different pull-down pre-driver signals (e.g., three different pull-down pre-driver signals include an inverted signal 134a and two different delayed inverted signals 134b and 134c). The pull-up and the pull-down paths 120, 130 can each further include a main driver 125 with multiple driver stages. For the pull-up path 120, the stages of the main driver 125 can receive the pull-up pre-driver signals 124a-124c, respectively, turning on sequentially due to the delay in order to reduce switching noise and add adjustable output slew-rate of the amplified data out signal at the output pad 150. Similarly, for the pull-down path 130, the stages of the main driver 135 can receive the pull-down pre-driver signals 134a-134c, respectively, turning on sequentially due to the delay in order to reduce switching noise and add adjustable output slew-rate of the amplified data out signal at the output pad 150.

Figure 1B:
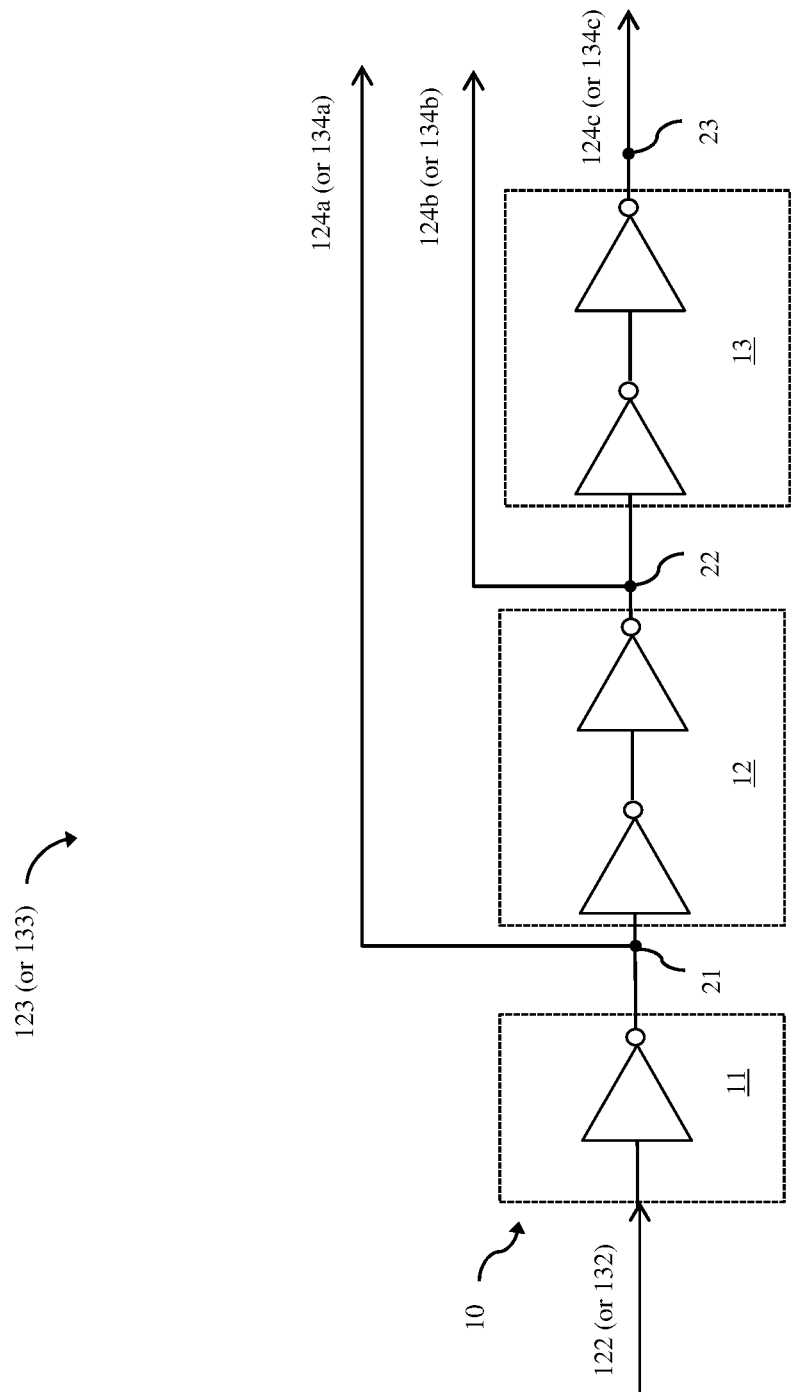
FIG. 1B is a schematic diagram illustrating a conventional pre-driver that can be incorporated into the pull-up and pull-down paths of the output driver of FIG. 1A.

Historically, in each pre-driver, the multiple different pre-driver signals (e.g., including an inverted signal and two different delayed inverted signals) are generated using field effect transistors (FETs) with different gate lengths and thereby different channel lengths to add the different delays. That is, the different pre-driver signals are generated through the use of FETs having different channel lengths, where the FETs with the longer channel lengths are used to achieve longer delays. Unfortunately, in advanced technology nodes (e.g., at the 12 nm fin-type field effect transistor (FinFET) technology node and beyond) there are process limitations that make increasing channel lengths difficult. To avoid using FETs having different channel lengths in the pre-drivers 123, 133, designers at these advanced technology nodes currently use an inverter chain 10 with taps 21-23 after stages 11-13, respectively (e.g., as shown in FIG. 1B), and further use remote voltage generators (not shown) for the power supply that controls the inverter chain 10. However, this solution is costly in terms of both area consumption and power consumption. Furthermore, the amount of delay provided by the inverter chain is typically not tunable (e.g., to account for process variation).

In view of the foregoing, disclosed herein are embodiments of a pre-driver (e.g., either a pull-up pre-driver or a pull-down pre-driver) for an output driver. The pre-driver includes multiple signal generation stages for generating and outputting multiple different pre-driver signals, respectively, and a local switching bias circuit with a first switch and a second switch. The first switch and primary inverters in each of the stages all receive the same input signal. When the input signal transitions from a first voltage level to a second voltage level, the first switch turns on the switching bias circuit in order to supply a bias voltage to each of the stages. However, the primary inverters do not concurrently invert the input signal. Instead, due to the bias voltage and further due to some additional circuitry within each stage (discussed in greater detail below), the primary inverters turn on in sequence, thereby ensuring that different pre-driver signals generated and output by the different stages, respectively, transition from the second voltage level to the first voltage level in sequence and at a slower rate than the transition of the input signal. Once the last pre-driver signal transitions to the first voltage level, the second switch turns off the switching bias circuit. Optionally, the switching bias circuit can include multiple bias voltage nodes and a multiplexor that selectively applies the bias voltage from only one of these nodes to the stages in order to tune the delay and transition times of the delay signals.

Figure 2:
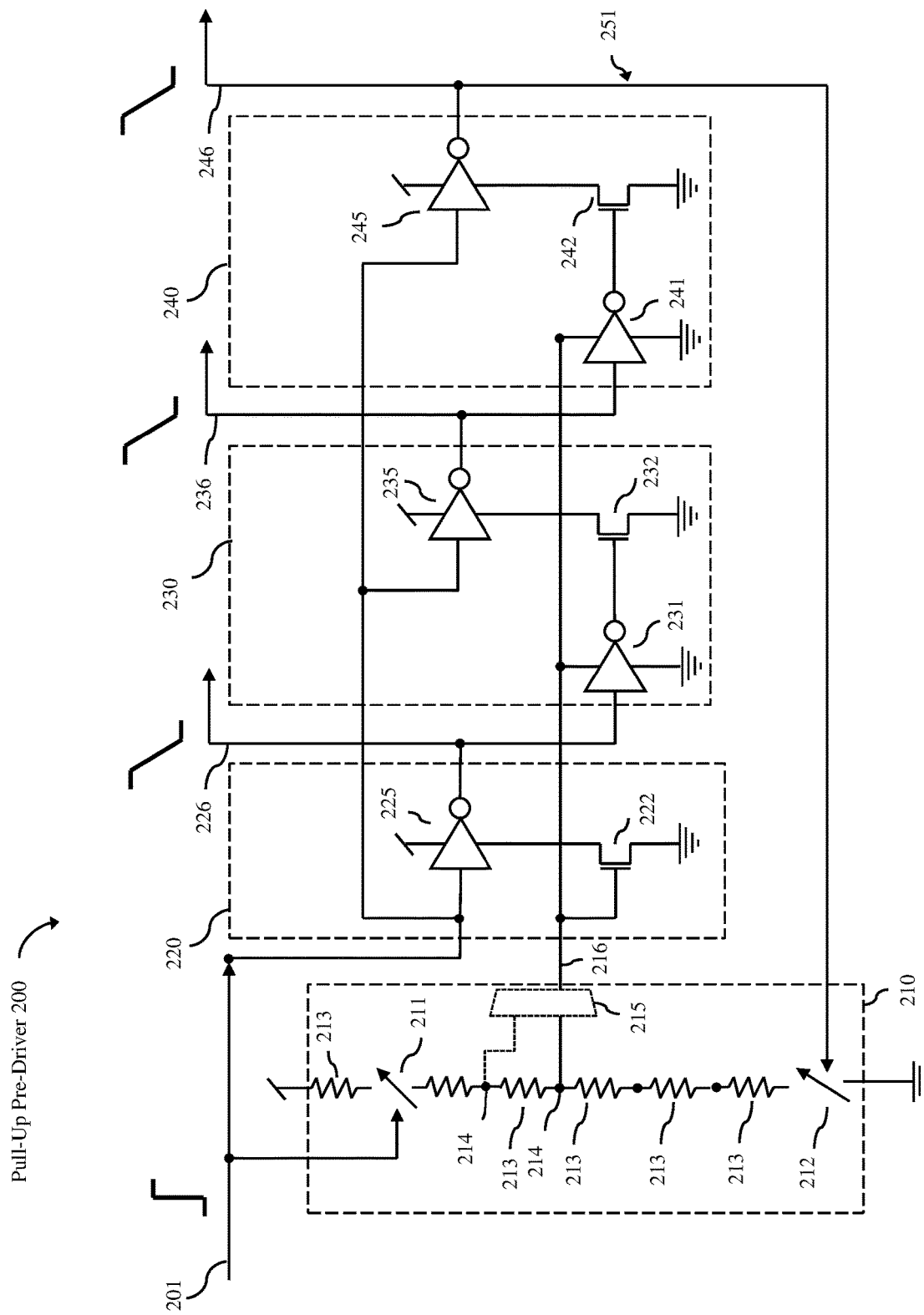
FIG. 2 is a schematic diagram illustrating an embodiment of a pull-up pre-driver.
Figure 3:
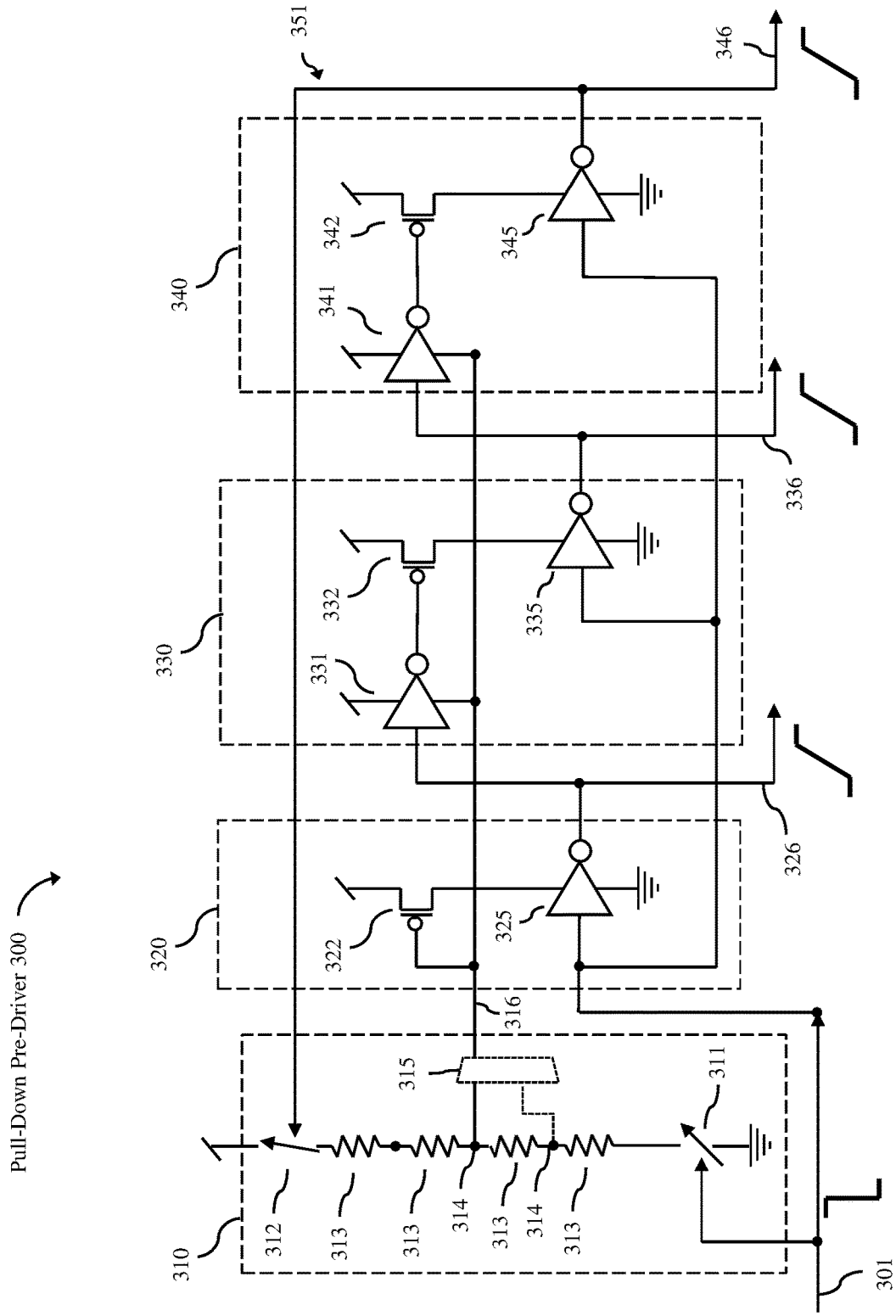
FIG. 3 is a schematic diagram illustrating an embodiment a pull-down pre-driver.

Generally, disclosed embodiments of pre-drivers for an output driver including a pull-up pre-driver 200, as shown in FIG. 2, and a pull-down pre-driver 300, as shown in FIG. 3. The pre-drivers 200/300 can each include: multiple signal generation stages 220/320, 230/330, 240/340 for generating and outputting different pre-driver signals 226/326, 236/336, 246/346, respectively, in response to an input signal 201/301. Each of the pre-drivers 200/300 can also include a local switching bias circuit 210/310 for providing a bias voltage 216/316 to each of the stages during generation of the pre-driver signals 226/326, 236/336, 246/346.

The switching bias circuit 210/310 can include a group of series-connected resistors 213/313. At one end, the series-connected resistors can be connected by a first switch 211/311 to a first voltage rail. At the opposite end, the series-connected resistors can be connected by a second switch 212/312 to a second voltage rail. As discussed in greater detail below, the first switch 211/311 can be controlled by the input signal 201/301 to the delay pre-driver 200/300 and the second switch 212/312 can be controlled by the last pre-driver signal 246/346 output by the last stage in a feedback loop 251/351 so that the switching bias circuit 210/310 is only turned on when needed. The switching bias circuit 210/310 can further include a bias voltage node 214/314 at a junction between adjacent resistors in the group. When turned on, the switching bias circuit 210/310 can generate (i.e., can be adapted to generate, can be configured to generate, etc.) a bias voltage 216/316 at some desired level at the bias voltage node 214/314. As discussed in greater detail below, level of the bias voltage 214/314 will vary depending upon whether the pre-driver is a pull-up pre-driver 200 as in FIG. 2 or a pull-down pre-driver 300 as in FIG. 3.

The multiple signal generation stages can include: a first stage 220/320 (also referred to herein as an inverter only stage); a second stage 230/330 (also referred to herein as a delay/inverter stage); and a last stage 240/340 (also referred to herein as an additional delay/inverter stage). Each stage can receive the same input signal 201, 301 and can generate and output a corresponding pre-driver signal. The first pre-driver signal 226/326, the second pre-driver signal 236/336, and last pre-driver signal 246/346 can all be inverted with respect to the input signal 201/301. Additionally, the second pre-driver signal 236/336 and the last pre-driver signal 246/346 can be delayed by different amounts. Thus, the first pre-driver signal 226/326, the second pre-driver signal 236/336 and the last pre-driver signal 246/346 transition in sequence. Furthermore, this transition occurs at a slower rate than the transition of the input signal 201/301. That is, the slew rate of the pre-driver signals is longer than the slew rate of the input signal 201/301.

To accomplish this, the stages 220/320, 230/330, 240/340 can each include a primary inverter 225/325, 235/335, 245/345, which is configured to receive and invert the same input signal 201/301. Each stage 220/320, 230/330, 240/340 can also include a power supply transistor 222/322, 232/332, 242/342 (e.g., an n-type field effect transistor (NFET) in the case of the pull-up pre-driver 200 and a p-type field effect transistor (PFET) in the case of the pull-down pre-driver 300), which is electrically connected to the primary inverter 225/325, 235/335, 245/345 and which is configured to supply power to the primary inverter 225/325, 235/335, 245/345 when a bias voltage 216/316 is applied to its gate. The connection between the power supply transistor 222/322, 232/332, 242/342 and the primary inverter 225/325, 235/335,245/345 is such that, when the power supply transistor 222/322, 232/332, 242/342 is turned on, the primary inverter 225/325, 235/335, 245/345 can output a pre-driver signal 226/326, 236/336, 246/346 that is inverted with respect to the input signal 201/301.

The bias voltage node 214/314 can be electrically coupled to (i.e., electrically connected to) each of the stages 220/320, 230/335, 240/340.

Specifically, in the first stage 220/320, the gate of the power supply transistor 222/322 is electrically connected to the bias voltage node 214/314 directly (or via a multiplexor 215/315, as discussed below) so that the power supply transistor 222/322 will turn on when the switching bias circuit 210/310 is turned on.

The second and last stages 230/330 and 240/340 can also each include a delay inverter 231/331, 241/341. The delay inverter 231/331, 241/341 in these stages can be electrically connected between the bias voltage node 214/314 and a voltage rail (e.g., ground in the case of the pull-up pre-driver 200 and a VDD rail in the case of the pull-down pre-driver 300). The inputs to the delay inverters 231/331, 241/341 can be the pre-driver signals from the primary inverters of the previous stages. That is, the input to the delay inverter 231/331 of the second stage 230/330 can be the first pre-driver signal 226/326 from the primary inverter 225/325 of the first stage 220/320 and the input to the delay inverter 241/341 of the third stage 240/340 can be the second pre-driver signal 236/336 from the primary inverter 235/335 of the second stage 230/330. Furthermore, the outputs of the delay inverters 231/331, 241/341 in the second and last stages 230/330, 240/340 can be applied to the gates of the power supply transistors 232/332, 242/342 in those stages, respectively. Thus, turning on of the power supply transistors 232/332, 242/342 in the second and last stages will occur when the outputs of the delay inverters 231/331, 241/341 switch to the bias voltage 216/316 level (as discussed in greater detail below).

Each of the pre-drivers 200/300 can operate as follows. The first switch 211/311 of the switching bias circuit 210/310 and the primary inverter 222/322, 232/332, 242/342 in each of the stages 220/320, 230/330, 240/340 can all receive the input signal 201/301. In response to this input signal 201/301 transitioning from a first voltage level to a second voltage level, the first switch 211/311 can turn on the switching bias circuit 210/310 so as to supply the bias voltage 216/316 to each of the stages 220/320, 230/330, 240/340.

In the first stage 220/320, the bias voltage 216/316 turns on the power supply transistor 222/322, thereby turning on the primary inverter 225/325. The primary inverter 225/325 can then generate and output the first pre-driver signal 226/326, which is inverted with respect to the input signal 201/301 (i.e., which transitions from the second voltage level to the first voltage level).

In the second stage 230/330, the bias voltage 216/316 enables operation of the delay inverter 231/331; however, the power supply transistor 232/332 does not turn on until the first pre-driver signal 226/326 from the primary inverter 235/325 of the first stage 220/320 has transitioned from the second voltage level to the first voltage level so that the output of the delay inverter 231/331, which is applied to the gate of the power supply transistor 232/332, has transitioned to the bias voltage level. Once the power supply transistor 232/332 in the second stage 230/330 is turned on, the primary inverter 235/335 of the second stage 230/330 can generate and output a second pre-driver signal 236/336 that is inverted and delayed with respect to the input signal 201/301.

In the last stage 240/340, the bias voltage 216/316 enables operation of the delay inverter 241/341; however, the power supply transistor 242/342 does not turn on until the second pre-driver signal 226/336 from the primary inverter 235/335 of the second stage 230/330 has transitioned from the second voltage level to the first voltage level so that the output from the delay inverter 241/341, which is applied to the gate of the power supply transistor 242/342, has transitioned to the bias voltage level. Once the power supply transistor 242/342 in the last stage 340 is turned on, the primary inverter 245/345 of the last stage 240/340 can generate and output a last pre-driver signal 246/346 that is inverted and further delayed with respect to the input signal 201/301. As mentioned above, the last pre-driver signal 246/346 output from the last stage 240/340 controls the second switch 212/312 and, when this last pre-driver signal 246/346 transitions from the second voltage level back to the first voltage level, the second switch 212/312 turns off the switching bias circuit 210/310. By turning off the switching bias circuit 310 once the pre-driver signals 226/326, 236/336, 246/346 are all generated, leakage current is reduced.

Thus, due to the power supply transistor 222/322 in the first stage 220/320 being turned on by the bias voltage 216/316 and further due to the configuration in the downstream stages where the delay inverters 231/331, 241/341 are powered by the bias voltage and have outputs that are dependent on the pre-driver signals 226/326, 236/336 from the previous stages and that control the on/off states of the power supply transistors 232/332, 242/342, the power supply transistors 222/322, 232/332, 242/342 in the stages 220/320, 230/330, 240/340, respectively, turn on in sequence and also act as weak resistors. Thus, the pre-driver signals 226/326, 236/336, 246/346 output from these stages 220/320, 230/330, 240/340, respectively, transition from the second voltage level to the first voltage level in sequence and also at a slower rate than the rate at which the input signal 201/301 transitions from the first voltage level to the second voltage level. By causing the transitions to occur in sequence and at a relatively slow rate, noise is reduced.

It should be noted that, depending upon whether the pre-driver is a pull-up pre-driver for the pull-up path of an output driver or a pull-down pre-driver of the pull-down path of the output driver, specific features of the circuit will vary.

For example, as mentioned above, in the pull-up pre-driver 200 of FIG. 2, the power supply transistors 222, 232, 242 can be NFETs. In this case, during a normal operating mode, the first switch 211 of the switching bias circuit 210 and the primary inverter 225, 235, 245 in each of the stages 220, 230, 240 can receive the input signal 201. In response to this input signal 201 transitioning from a low voltage level to a high voltage level, the first switch 211 (e.g., an NFET or some other suitable type of switch) can turn on the switching bias circuit 210 in order to supply a bias voltage 216, which is at some specific bias voltage level within a range from approximately one-half of VDD to VDD, to each of the stages 220, 230, 240. In the first stage 220, this bias voltage 216 can be applied to the gate of the NFET power supply transistor 222, thereby turning on the NFET power supply transistor 222 and enabling operation of the primary inverter 225. The primary inverter 225 can generate and output a first pull-up pre-driver signal 226, which is inverted with respect to the input signal 201 (i.e., which transitions from the high voltage level to the low voltage level). Since the bias voltage 216 is less than VDD, but above one-half VDD, the NFET power supply transistor 222 will turn on but at a relatively slow switching speed. In the second stage 230, the NFET power supply transistor 232 does not turn on until the first pull-up pre-driver signal 226 from the primary inverter 225 of the first stage 220 has transitioned from the high voltage level to the low voltage level and the output from the delay inverter 231, which is applied to the gate of the NFET power supply transistor 232, has transitioned to the bias voltage level. Once the NFET power supply transistor 232 in the second stage 230 is turned on, the primary inverter 235 of the second stage 230 can generate and output a second pull-up pre-driver signal 236 that is inverted and delayed with respect to the input signal 201. In the last stage 240, the NFET power supply transistor 242 does not turn on until the second pull-up pre-driver signal 236 from the primary inverter 235 of the second stage 230 has transitioned from the high voltage level to the low voltage level and the output from the delay inverter 241, which is applied to the gate of the NFET power supply transistor 242, has transitioned to the bias voltage level. Once the NFET power supply transistor 242 in the last stage 240 is turned on, the primary inverter 245 of the last stage 240 can generate and output the last pull-up pre-driver signal 246 that is inverted and further delayed with respect to the input signal 201. The last pull-up pre-driver signal 246, which is output from the last stage 240, can be applied to the second switch 212 in a feedback loop 251. Thus, the last pull-up pre-driver signal 246 can control the second switch 212 (e.g., another NFET or some other suitable type of switch) and thereby the on/off state of the switching bias circuit 210. Thus, when this last pull-up pre-driver signal 246 transitions from the high voltage level back to the low voltage level, the second switch 212 can turn off the switching bias circuit 210. It should be noted that in such a pull-up pre-driver, switch point of the delay inverters in the second and third stages is lowered down so that it is between the bias voltage and VSS because VDD is not used as a power supply. This helps increase the delay of the delay inverters. Otherwise, multiple inverting stages will be needed to create delay.

Also, as mentioned above, in the pull-down pre-driver 300 of FIG. 3, the power supply transistors 322, 332, 342 can be PFETs. In this case, during a normal operating mode, the first switch 311 of the switching bias circuit 310 and the primary inverter 325, 335, 345 in each of the stages 320, 330, 340 can all receive the input signal 301. In response to this input signal 301 transitioning from a high voltage level to a low voltage level, the first switch 311 (e.g., a PFET or some other suitable type of switch) can turn on the switching bias circuit 310 and supply a bias voltage 316, which is at some specific bias voltage level within a range from VSS to approximately one-half VDD, to each of the stages 320, 330, 340. In the first stage 320, this bias voltage 316 can be applied to the gate of the PFET power supply transistor 322, thereby turning on the PFET power supply transistor 322 and enabling operation of the primary inverter 325. The primary inverter 325 can then generate and output the first pull-down pre-driver signal 326, which is inverted with respect to the input signal 301 (i.e., which transitions from the low voltage level to the high voltage level). Since the bias voltage 316 is greater than ground but less than one-half VDD, the PFET will turn on but at a relatively slow switching speed. In the second stage 330, the PFET power supply transistor 332 does not turn on until the first pull-down pre-driver signal 326 from the primary inverter 325 of the first stage 320 has transitioned from the low voltage level to the high voltage level and the output from the delay inverter 331, which is applied to the gate of the PFET power supply transistor 332, has transitioned to the bias voltage level. Once the PFET power supply transistor 332 in the second stage 330 is turned on, the primary inverter 335 of the second stage 330 can generate and output a second pull-down pre-driver signal 336 that is inverted and delayed with respect to the input signal 301. In the last stage 340, the PFET power supply transistor 342 does not turn on until the second pull-down pre-driver signal 336 from the primary inverter 335 of the second stage 330 has transitioned from the low voltage level to the high voltage level and the output from the delay inverter 341, which is applied to the gate of the PFET power supply transistor 342, has transitioned to the bias voltage level. Once the PFET power supply transistor 342 in the last stage 340 is turned on, the primary inverter 345 of the last stage 340 can generate and output the last pull-down pre-driver signal 346 that is inverted and further delayed with respect to the input signal 301. The last pull-down pre-driver signal 346 output from the last stage 340 can be applied to the second switch 312 in a feedback loop 351. Thus, the last pull-down pre-driver signal 346 can control the second switch 312 (e.g., another PFET or some other suitable type of switch) and thereby the on/off state of the switching bias circuit 310. Thus, when this last pull-down pre-driver signal 346 transitions from the low voltage level back to the high voltage level, the second switch 312 can turn off the switching bias circuit 310. It should be noted that in such a pull-down pre-driver 300, the switch point of the delay inverters 331, 341 is raised up to between the bias voltage and VDD because VSS is not used as a power supply. This helps increase the delay of the delay inverters. Otherwise, multiple inverting stages will be needed to create delay.

It should be noted that in each of the pre-drivers 200/300 described above and illustrated in FIGS. 2 and 3, respectively, the switching bias circuit 210/310 can include a single bias voltage node 214/314 at a junction between adjacent resistors and directly electrically connected to each of the stages. Alternatively, the switching bias circuit can include: multiple bias voltage nodes 214/314 at junctions between adjacent resistors; and a multiplexor 215/315, which can be controlled by a control signal in order to selectively electrically connect one of the multiple bias voltage nodes to each the stages 220/320, 230/330, 240/340 in order to tune delay and transition times of the pre-driver signals 226/326, 236/336, 246/346. Each of the pre-drivers 200/300 can also optionally incorporate a bypass circuit (not shown) that is configured to allow for operation in a bypass mode. During the bypass mode, transitioning of the delay signals can be forced to occur concurrently.

Figure 4:
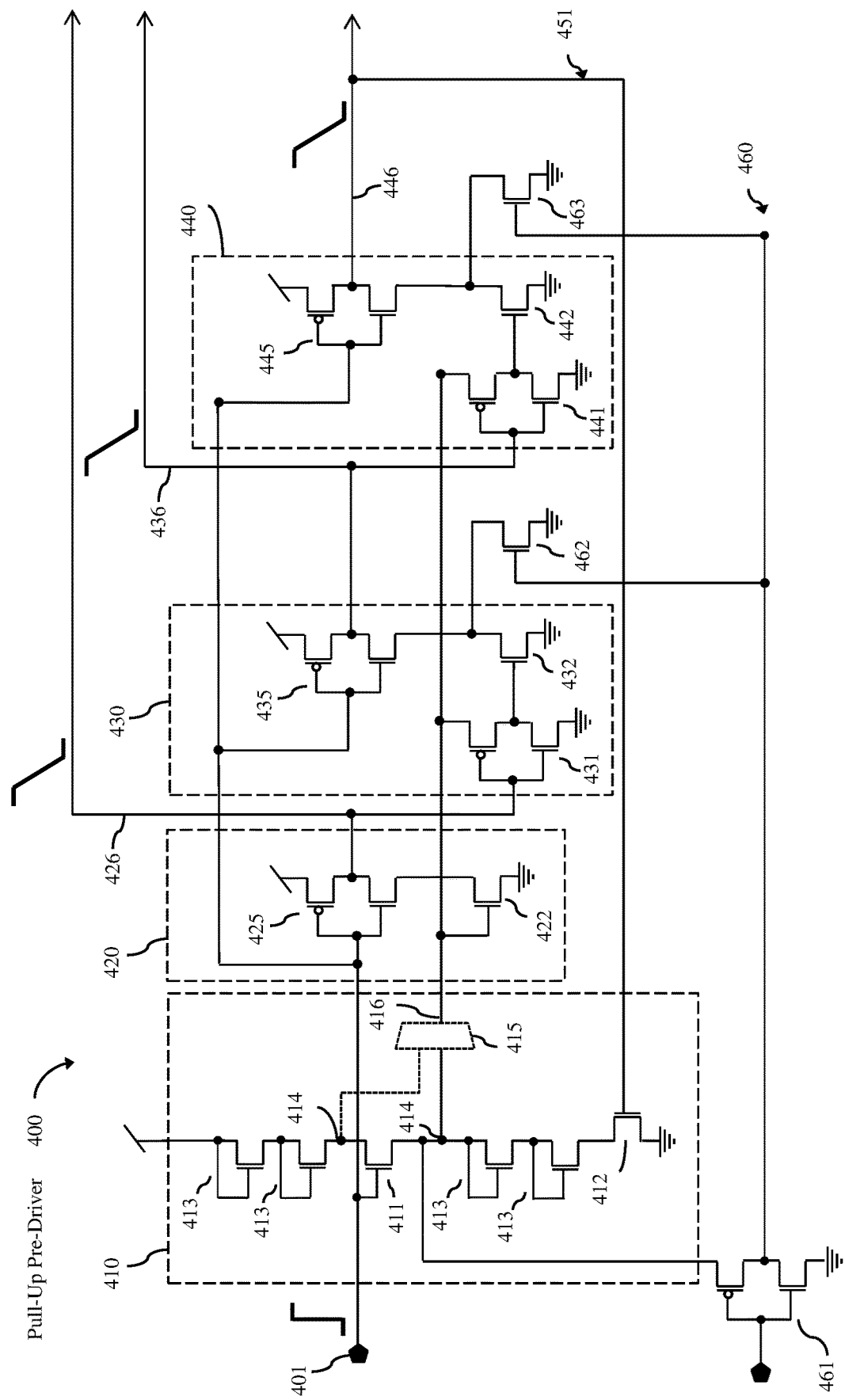
FIG. 4 is a schematic diagram illustrating an embodiment of a pull-up pre-driver.

FIG. 4 is a schematic diagram illustrating one specific embodiment of a pull-up pre-driver 400 for the pull-up path of an output driver.

The pull-up pre-driver 400 can include multiple signal generation stages 420, 430, 440 for generating and outputting pull-up pre-driver signals 426, 436, 446, respectively, based on an input signal 401. The pull-up pre-driver 400 can also include a local switching bias circuit 410 for generating and supplying a bias voltage 416, which is at some specific bias voltage level within a range from approximately one-half VDD to VDD, to each the stages during generation of the pull-up pre-driver signals 426, 436, 446.

The switching bias circuit 410 can include a group of series-connected resistors. At or near one end, the group of series-connected resistors can be connected by a first switch 411 to a positive voltage rail (e.g., at VDD). At or near the other end, the group of series-connected resistors can be connected by a second switch 412 to a ground rail (or, alternatively, a negative voltage rail) (e.g., at VSS). In this specific embodiment, the switching bias circuit 410 can include a group (also referred to herein as a chain) of n-type field effect transistors (NFETs) that are electrically connected in series between VDD and VSS. Two of the NFETs in the chain can be configured as on/off switches 411 and 412. That is, a first NFET switch 411 can be in the chain at or near the end closest to VDD and a second NFET switch 412 can be in the chain at or near the end closest to VSS. All of the others NFETs in the chain can be diode-connected transistors 413. Those skilled in the art will recognize that diode-connected transistors are field effect transistors whose gate and drain region are shorted together. Thus, functionally, diode-connected transistors are resistors.

The first NFET switch 411 can be controlled by the input signal 401 to the pull-up pre-driver 400 and the second NFET switch 412 can be controlled by the last pull-up pre-driver signal 446, which is output by the last stage 440. Thus, the switching bias circuit 410 is only turned on when needed in order to reduce leakage. The switching bias circuit 410 can further include a bias voltage node 414 at a junction between adjacent NFETs in the group. When turned on, the switching bias circuit 410 can generate (i.e., can be adapted to generate, can be configured to generate, etc.) a bias voltage 416 at the bias voltage node 414. This bias voltage 416 can be at some specific bias voltage level within a range from approximately one-half VDD to VDD (e.g., due to placement of the bias voltage node along the chain closer to VDD than VSS). It should be noted that the number of diode-connected transistors shown is not intended to be limiting. Any suitable number of diode-connected transistors could be employed in order to achieve the desired bias voltage.

The multiple signal generation stages can include: a first stage 420 (also referred to herein as an inverter only stage); a second stage 430 (also referred to herein as a delay/inverter stage); and a last stage 440 (also referred to herein as an additional delay/inverter stage). Each stage 420, 430, 440 can receive the same input signal 401 and can generate and output a corresponding pull-up pre-driver signal 426, 436, 446. The pull-up pre-driver signals 426, 436, 446 can all be inverted with respect to the input signal 401 and can transition in sequence. That is, the first pull-up pre-driver signal 426 can be inverted with respect to the input signal 401, the second pull-up pre-driver signal 436 can be inverted and delayed with respect to the input signal 401, and, finally, the last pull-up pre-driver signal 446 can be inverted and further delayed with respect to the input signal 401. Additionally, transition of the pull-up pre-driver signals 426, 436, 446 can occur at a slower rate than the input signal 401. That is, the slew rate of the pull-up pre-driver signals 426, 436, 446 can be relatively long as compared to the slew rate of the input signal 401.

To accomplish this, each stage 420, 430, 440 can include a primary inverter 425, 435, 445, which is configured to receive and invert the input signal 401. Each stage 420, 430, 440 can also include an NFET power supply transistor 422, 432, 442, which is electrically connected to the primary inverter 425, 435, 445 and which is configured to supply power to the primary inverter 425, 435, 445. Specifically, the primary inverter 425, 435, 445 and NFET power supply transistor 422, 432, 442 can be connected in series between VDD and VSS. That is, the NFET power supply transistor 422, 432, 442 can have a source region electrically connected to VSS. The primary inverter 425, 435, 445 can include a PFET having a source region electrically connected to VDD and an NFET connected in series between a drain region of the PFET and a drain region of the NFET power supply transistor. The gates of the PFET and NFET of each primary inverter 425, 435, 445 can be electrically connected to an input node for the pull-up pre-driver 400. Thus, within each stage 420, 430, 440, when the NFET power supply transistor 422, 432, 442 is turned on, a pull-up pre-driver signal 426, 436, 446 that is inverted with respect to the input signal 401 can be output by the primary inverter 425, 435, 445 on an output node at a junction between the PFET and NFET of that primary inverter 425, 435, 445.

The bias voltage node 414 can be electrically coupled to (i.e., electrically connected to) each of the stages 420, 430, 440.

Specifically, in the first stage 420, the gate of the NFET power supply transistor 422 can be electrically connected to the bias voltage node 414 (either directly or through a multiplexor 415, as discussed below) such that, when the switching bias circuit 410 is turned on and the bias voltage 416 (which as mentioned above is at a specific bias voltage level within a range from approximately one-half VDD to VDD) is applied to the gate of the NFET power supply transistor 422, the NFET power supply transistor 422 weakly turns on. Then the primary inverter 425 can generate and output a first pull-up pre-driver signal 426 that is inverted with respect to the input signal 401.

The second and last stages 430 and 440 can also include a delay inverter 431, 441. The delay inverter 431, 441 can include a PFET and an NFET electrically connected in series between the bias voltage node 414 (not VDD) and VSS. The gates of the PFET and NFET of the delay inverter 431, 441 can be electrically connected to the output node of the primary inverter from the previous stage. Thus, the input to the delay inverter 431, 441 is the pull-up pre-driver signal from the primary inverter of the previous stage. That is, the input to the delay inverter 431 in the second stage 430 is the first pull-up pre-driver signal 426 from the primary inverter 425 of the first stage 420 and the input to the delay inverter 441 of the last stage 440 is the second pull-up pre-driver signal 436 from the primary inverter 435 of the second stage 430. The gate of the NFET power supply transistor 432, 442 can be electrically connected to the junction between the PFET and the NFET of the delay inverter 431, 441. That is, the output of the delay inverter 431, 441 will be applied to the gate of the NFET power supply transistor 432, 442 in the same stage 430, 440.

The switch point of the delay inverters 431, 441 is bias voltage dependent. More particularly, the switch point of the delay inverters 431, 441 is dropped to between bias voltage 416 and VSS because the bias voltage 416 is used to power the delay inverters instead of VDD. This helps to reduce delay cell size. Furthermore, the output of the delay inverters 431, 441 will be either at ground (if the voltage level of the received pull-up pre-driver signal is high) or at the bias voltage level (if the voltage level of the received pull-up pre-driver signal is low). As a result, the NFET power supply transistors 432, 442 in the second and last stages 430, 440 only turn on when the pull-up pre-driver signal from the previous stage switches from a high voltage level to a low voltage level causing the output of the delay inverter 431, 441 to transition to the bias voltage level. Thus, the same bias voltage level is used to turn on the NFET power supply transistors 422, 432, 442.

During a normal operating mode in the pull-up pre-driver 400, the first NFET switch 411 of the switching bias circuit 410 and the primary inverter 425, 435, 445 in each of the stages 420, 430, 440 can receive the same input signal 401. In response to this input signal 401 transitioning from a low voltage level (e.g., at VSS) to a high voltage level (e.g., at VDD), the first NFET switch 411 can turn on the switching bias circuit 410 to supply the bias voltage 416 through the bias voltage node 414 to each of the stages 420, 430, 440. In the first stage 420, the bias voltage 416 turns on the NFET power supply transistor 422, thereby turning on the primary inverter 425. The primary inverter 425 then generates and outputs a first pull-up pre-driver signal 426 that is inverted with respect to the input signal 401 (i.e., that transitions from the high voltage level to the low voltage level). In the second stage 430, the bias voltage 416 enables operation of the delay inverter 431; however, the NFET power supply transistor 432 does not turn on until the first pull-up pre-driver signal 426 from the primary inverter 425 of the first stage 420 has transitioned from the high voltage level to the low voltage level and the output from the delay inverter 431, which is applied to the gate of the power supply transistor 432, has transitioned to the bias voltage 416 level. Once the NFET power supply transistor 432 in the second stage 430 is turned on, the primary inverter 435 of the second stage 430 can generate and output a second pull-up pre-driver signal 436 that is inverted and delayed with respect to the input signal 401. In the last stage 440, the bias voltage 416 enables operation of the delay inverter 441; however, the NFET power supply transistor 442 does not turn on until the second pull-up pre-driver signal 436 from the primary inverter 435 of the second stage 430 has transitioned from the high voltage level to the low voltage level and the output from the delay inverter 441, which is applied to the gate of the NFET power supply transistor 442, has transitioned to the bias voltage 416 level. Once the NFET power supply transistor 442 in the last stage 440 is turned on, the primary inverter 445 of the last stage 440 can generate and output a last pull-up pre-driver signal 446 that is inverted and further delayed with respect to the input signal 401. The last pull-up pre-driver signal 446, which is output from the last stage 440, can applied to the gate terminal of the second NFET switch 412 in a feedback loop 451. Thus, when this last pull-up pre-driver signal 446 transitions from the high voltage level back to the low voltage level, the second NFET switch 412 can turn off the switching bias circuit 410.

Due to the bias voltage 416 being applied to the NFET power supply transistor 422 in the first stage 420 and further due to the configuration in the downstream stages where the outputs from the delay inverters 431, 441 are at ground or at the bias voltage level depending upon the pull-up pre-driver signal from the previous stage and where the outputs from the delay inverters 431, 441 control the on/off states of the NFET power supply transistors 432, 442, the NFET power supply transistors 422, 432, 442 in the stages 420, 430, 440, respectively, turn on in sequence and also act as weak resistors. Thus, the pull-up pre-driver signals 426, 436, 446 transition from the high voltage level to the low voltage level in sequence and also at a slower rate than that the rate at which the input signal 401 transitions. By causing the transitions in the pull-up pre-driver signals to occur in sequence and at a relatively slow rate, noise is reduced.

It should be noted that, in the pull-up pre-driver 400 of FIG. 4, the switching bias circuit 410 can include a single bias voltage node 414 at a junction between adjacent transistors in the chain and directly electrically connected to each of the stages. Alternatively, the switching bias circuit 410 can include a multiplexor 415, which has multiple inputs that are electrically connected to multiple bias voltage nodes 414 at different junctions between adjacent transistors in the chain and which has an output electrically connected to each of the stages 420, 430, 440. In this case, the multiplexor 415 can be controlled by a control signal in order to selectively electrically connect one of the multiple bias voltage nodes to each the stages 420, 430, 440 in order to tune delay and transition times of the pull-up pre-driver signals 426, 436, 446.

Optionally, the pull-up pre-driver 400 can further be configured with a bypass circuit 460 that enables operation in a bypass mode (also referred to herein as a fast mode). During the bypass mode, the bypass circuit ensures that transitioning of the pull-up pre-driver signals 426, 436, 446 from the high voltage level to the low voltage level occurs concurrently. For example, the bypass circuit 460 of the pull-up pre-driver 400 can include bypass inverter 461 electrically connected in series between the bias voltage node 414 and ground. The input to the bypass inverter 461 can be a bypass enable signal and the output can be electrically connected to the gates of additional NFETs 462 and 463. The additional NFETs can be associated with all of the stages except the first stage 420. Each additional NFET can have a source region electrically connected to ground and a drain region electrically connected to the junction between the NFET power supply transistor and the primary inverter of a given stage. Thus, for example, as shown in FIG. 4, the additional NFET 462 can have a source region electrically connected to ground and a drain region electrically connected to the junction between the NFET power supply transistor 432 and the primary inverter 435 of the second stage 430. Another additional NFET 463 can have a source region electrically connected to ground and a drain region electrically connected to the junction between the NFET power supply transistor 442 and the primary inverter 445 of the last stage 440. With this configuration, if/when the bypass signal is low, the additional NFETs will turn on in order to enable the primary inverters 435, 445 in the later stages 430, 440 concurrently with the primary inverter 425 in the first stage 420 such that all of the pull-up pre-driver signals 426, 436, 446 will transition from the high voltage level to the low voltage level concurrently.

Figure 5:
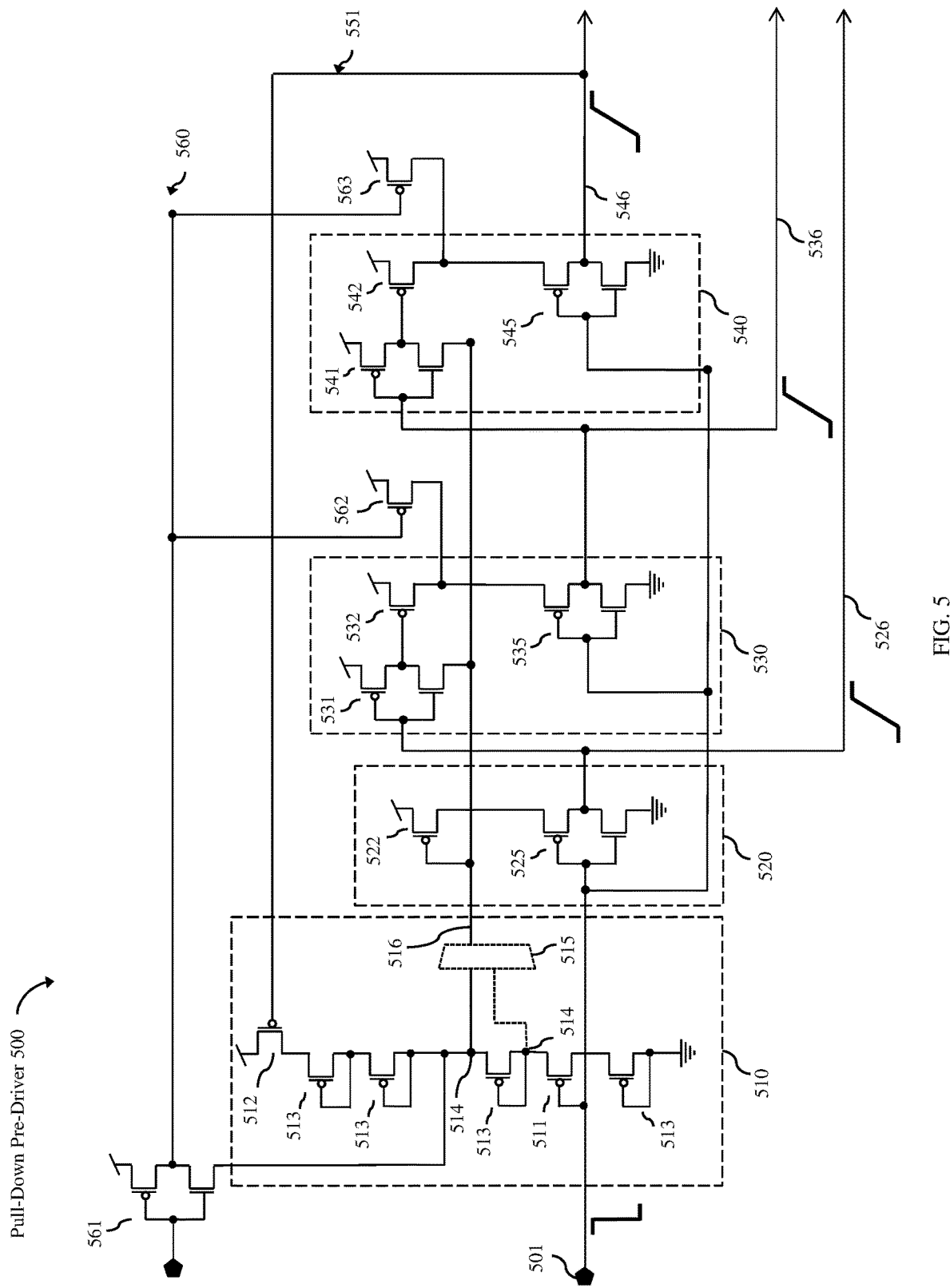
FIG. 5 is a schematic diagram illustrating an embodiment a pull-down pre-driver.

FIG. 5 is a schematic diagram illustrating one specific embodiment of a pull-down pre-driver 500 for the pull-down path of an output driver.

The pull-down pre-driver 500 includes multiple signal generation stages 520, 530, 540 for generating and outputting pull-down pre-driver signals 526, 536, 546, respectively, based on an input signal 501. The pull-down pre-driver can also include a local switching bias circuit 510 for generating a supplying a bias voltage 516, which is at some specific bias voltage level within a range from VSS to approximately one-half VDD, to each of the stages during generation of the pull-down pre-driver signals 526, 536, 546.

The switching bias circuit 510 can include a group of series-connected resistors. At or near one end, the group of series-connected resistors can be connected by a first switch 511 to a ground rail (or, alternatively, a negative voltage rail) (e.g., at VSS). At the other end, the group of series-connected resistors can be connected by a second switch 512 to a positive voltage rail (e.g., at VDD). More specifically, in this embodiment, the switching bias circuit 510 can include a group (also referred to herein as a chain) of p-type field effect transistors (PFETs) that are connected in series between VDD and VSS. Two of the PFETs in the chain can be configured as on/off switches 511, 512. That is, a first PFET switch 511 can be in the chain at or near the end closest to VSS and a second PFET switch 512 can be in the chain at or near the end closest to VDD. All of the others PFETs in the chain can be diode-connected transistors 513. Those skilled in the art will recognize that diode-connected transistors are field effect transistors whose gate and drain region are shorted together. Thus, functionally, diode-connected transistors are resistors.

The first PFET switch 511 can be controlled by the input signal 501 to the pull-down pre-driver 500 and the second PFET switch 512 can be controlled by the last pull-down pre-driver signal 546, which is output by the last stage 540. Thus, the switching bias circuit 510 is only turned on when needed in order to reduce leakage. The switching bias circuit 510 can further include a bias voltage node 514 at a junction between adjacent PFETs in the group. When turned on, the switching bias circuit 510 can generate (i.e., can be adapted to generate, can be configured to generate, etc.) a bias voltage 516 at some desired level at the bias voltage node 514. This bias voltage 416 can be at some specific bias voltage level within a range from VSS to approximately one-half VDD (e.g., due to placement of the bias voltage node along the chain closer to VSS than VDD). It should be noted that the number of diode-connected transistors shown is not intended to be limiting. Any suitable number of diode-connected transistors could be employed in order to achieve the desired bias voltage.

The multiple signal generation stages can include: a first stage 520 (also referred to herein as an inverter only stage); a second stage 530 (also referred to herein as a delay/inverter stage); and a last stage 540 (also referred to herein as an additional delay/inverter stage). Each stage 520, 530, 540 can receive the same input signal 501 and can generate and output a corresponding pull-down pre-driver signal 526, 536, 546. The pull-down pre-driver signals 526, 536, 546 can all be inverted with respect to the input signal 501 and can transition in sequence. That is, the first pull-down pre-driver signal 526 can be inverted with respect to the input signal 501, the second pull-down pre-driver signal 536 can be inverted and delayed with respect to the input signal 501, and, finally, the last pull-down pre-driver signal 546 can be inverted and further delayed with respect to the input signal 501. Additionally, transition of the pull-down pre-driver signals 526, 536, 546 can occur at a slower rate than the input signal 501. That is, the slew rate of the pull-down pre-driver signals 526, 536, 546 can be relatively long as compared to the slew rate of the input signal 501.

To accomplish this, each stage 520, 530, 540 can include a primary inverter 525, 535, 545, which is configured to receive and invert the input signal 501. Each stage 520, 530, 540 can also include a PFET power supply transistor 522, 532, 542, which is electrically connected to the primary inverter 525, 535, 545 and which is configured supply power to the primary inverter 525, 535, 545. Specifically, a PFET power supply transistor 522, 532, 542 and the primary inverter 525, 535, 545 can be connected in series between the VDD and VSS. That is, the PFET power supply transistor 522, 532, 542 can have a source region electrically connected to VDD. The primary inverter 525, 535, 545 can include an NFET having a source region electrically connected to VSS and a PFET connected in series between a drain region of the NFET and a drain region of the PFET power supply transistor. The gates of the PFET and NFET of each primary inverter 525, 535, 545 can be electrically connected to an input node for the pull-down pre-driver 500. Thus, within each stage 520, 530, 540, when the PFET power supply transistor 522, 532, 542 is turned on, a pull-down pre-driver signal 526, 536, 546 that is inverted with respect to the input signal 501 can be output by the primary inverter 525, 535, 545 at an output node that is at a junction between the PFET and NFET of that primary inverter.

The bias voltage node 514 can be electrically coupled to (i.e., electrically connected to) each of the stages 520, 530, 540.

Specifically, in the first stage 520, the gate of the PFET power supply transistor 522 can be electrically connected to the bias voltage node 514 (either directly or through a multiplexor 515, as discussed below) such that, when the switching bias circuit 510 is turned on and the bias voltage 516 (which as mentioned above is at some specific bias voltage level within a range from VSS to approximately one-half VDD) is applied to the gate of the PFET power supply transistor 522, the PFET power supply transistor 522 weakly turns on. Then the primary inverter 525 can generate and output a first pull-down pre-driver signal 526 that is inverted with respect to the input signal 501.

The second and last stages 530 and 540 can also include a delay inverter 531, 541. The delay inverter 531, 541 can include a PFET and an NFET electrically connected in series between the VDD and the bias voltage node 514 (not VSS). The gates of the PFET and NFET of the delay inverter 531, 541 can be electrically connected to the output node of the primary inverter from the previous stage. Thus, the input to the delay inverter 531, 541 is the pull-down pre-driver signal from the primary inverter of the previous stage. That is, the input to the delay inverter 531 in the second stage 530 is the first pull-down pre-driver signal 526 from the primary inverter 525 of the first stage 520 and the input to the delay inverter 541 of the last stage 540 is the second pull-down pre-driver signal 536 from the primary inverter 535 of the second stage 530. The gate of the PFET power supply transistor 532, 542 can be electrically connected to the junction between the PFET and the NFET of the delay inverter 531, 541. That is, the output of the delay inverter 531, 541 will be applied to the gate of the PFET power supply transistor 532, 542 in the same stage 530, 540.

The switch point of the delay inverters 531, 541 is bias voltage dependent. More particularly, the switch point of the delay inverters is increased to between the bias voltage 516 and VDD because the bias voltage 516 is used to power the delay inverters instead of VSS. This helps to reduce delay cell size. Furthermore, the output of the delay inverters 531, 541 will be either at VDD (if the voltage level of the received pull-down pre-driver signal is low) or at the bias voltage level (if the voltage level of the received pull-down pre-driver signal is high). As a result, the PFET power supply transistors 532, 542 in the second and last stages 530, 540 only turn on when the pull-down pre-driver signal from the previous stage switches from a low voltage level to a high voltage level causing the output of the delay inverter 531, 541 to transition to the bias voltage level. Thus, the same bias voltage level is used to turn on the PFET power supply transistors 522, 532, 542.

During a normal operating mode in the pull-down pre-driver 500, the first PFET switch 511 of the switching bias circuit 510 and the primary inverter 525, 535, 545 in each of the stages 520, 530, 540 can receive the same input signal 501. In response to this input signal 501 transitioning from a high voltage level (e.g., at VDD) to a low voltage level (e.g., at VSS), the first PFET switch 511 can turn on the switching bias circuit 510 to supply the bias voltage 516 to each of the stages 520, 530, 540. In the first stage 520, the bias voltage 516 turns on the PFET power supply transistor 522, thereby turning on the primary inverter 525. The primary inverter 525 then generates and outputs a first pull-down pre-driver signal 526 that is inverted with respect to the input signal 501 (i.e., that transitions from the low voltage level to the high voltage level). In the second stage 530, the bias voltage 516 enables operation of the delay inverter 531; however, the PFET power supply transistor 532 does not turn on until the first pull-down pre-driver signal 526 from the primary inverter 525 of the first stage 520 has transitioned from the low voltage level to the high voltage level and the output from the delay inverter 531, which is applied to the gate of the power supply transistor 532, has transitioned to the bias voltage level. Once the PFET power supply transistor 532 in the second stage 530 is turned on, the primary inverter 435 of the second stage 530 can generate and output a second pull-down pre-driver signal 536 that is inverted and delayed with respect to the input signal 501. In the last stage 540, the bias voltage 516 enables operation of the delay inverter 541; however, the PFET power supply transistor 542 does not turn on until the second pull-down pre-driver signal 536 from the primary inverter 535 of the second stage 530 has transitioned from the low voltage level to the high voltage level and the output from the delay inverter 541, which is applied to the gate of the PFET power supply transistor 542, has transitioned to the bias voltage level. Once the PFET power supply transistor 542 in the last stage 540 is turned on, the primary inverter 545 of the last stage 540 can generate and output a last pull-down pre-driver signal 546 that is inverted and further delayed with respect to the input signal 501. As mentioned above, the last pull-down pre-driver signal 546, which is output from the last stage 540, can be applied to the gate terminal of the second PFET switch 512 in a feedback loop 551. Thus, when this last pull-down pre-driver signal 546 transitions from the low voltage level back to the high voltage level, the second PFET switch 512 can turn off the switching bias circuit 510.

Due to the bias voltage 516 being applied to the PFET power supply transistor 522 in the first stage 520 and further due to the configuration in the downstream stages where the outputs from the delay inverters 531, 541 are at the bias voltage level or VDD depending upon the pull-down pre-driver signal from the previous stage and where the outputs from the delay inverters 531, 541 control the on/off states of the PFET power supply transistors 532, 542, the PFET power supply transistors 522, 532, 542 in the stages 520, 530, 540, respectively, turn on in sequence and also act as weak resistors. Thus, the pull-down pre-driver signals 526, 436, 546 from transition from the low voltage level to the high voltage level in sequence and also at a slower rate than that the rate at which the input signal 501 transitions. By causing the transitions in the pull-down pre-driver signals to occur in sequence and at a relatively slow rate, noise is reduced.

It should be noted that, in the pull-down pre-driver 500 of FIG. 5, the switching bias circuit 510 can include a single bias voltage node 514 at a junction between adjacent transistors in the chain and directly electrically connected to each of the stages. Alternatively, the switching bias circuit 510 can include a multiplexor 515, which has multiple inputs that are electrically connected to multiple bias voltage nodes 514 at different junctions between adjacent transistors in the chain and which has an output electrically connected to each of the stages 520, 530, 540. In this case, the multiplexor 515 can be controlled by a control signal in order to selectively electrically connect one of the multiple bias voltage nodes to each the stages 520, 530, 540 in order to tune delay and transition times of the pull-down pre-driver signals 526, 536, 546.

Optionally, the pull-down pre-driver 500 can further be configured with a bypass circuit 560 that enables operation in a bypass mode (also referred to herein as a fast mode). During the bypass mode, the bypass circuit ensures that transitioning of the pull-down pre-driver signals 526, 536, 546 from the low voltage level to the high voltage level occurs concurrently. For example, the bypass circuit 560 of the pull-down pre-driver 500 can include bypass inverter 561 electrically connected in series between the positive voltage rail and the bias voltage node 514. The input to the bypass inverter 561 can be a bypass enable signal and the output can be electrically connected to the gates of additional PFETs 562 and 563. The additional PFETs can be associated with all of the stages except the first stage 520. Each additional PFET can have a source region electrically connected to a positive voltage rail and a drain region electrically connected to the junction between the PFET power supply transistor and the primary inverter of a given stage. Thus, for example, as shown in FIG. 5, the additional PFET 562 can have a source region electrically connected to the positive voltage rail and a drain region electrically connected to the junction between the PFET power supply transistor 532 and the primary inverter 535 of the second stage 530. Another additional PFET 563 can have a source region electrically connected to the positive voltage rail and a drain region electrically connected to the junction between the PFET power supply transistor 542 and the primary inverter 545 of the last stage 540. With this configuration, if/when the bypass signal is high, the additional PFETs will turn on in order to enable the primary inverters 535, 545 in the later stages 530, 540 concurrently with the primary inverter 525 in the first stage 520 such that all of the pull-down pre-driver signals 526, 536, 546 will transition from the low voltage level to the high voltage level concurrently.

It should be understood that in each of the pre-driver embodiments described above and illustrated in FIGS. 2-5 the specific location(s) of the bias node(s) 214/314/414/514 within the chain of resistors are shown for illustration purposes and not intended to be limiting. The goal of the location of any given bias node is to achieve a specific bias voltage that is optimal for operation of the different stages of the pre-driver. As mentioned above, for the disclosed pull-up pre-driver 200/400, the bias voltage 216/416 on the bias node 214/414 should be at some specific level within a range from approximately one-half VDD to VDD. This specific level should be sufficiently high to turn on the NFET power supply transistor 222/422 in the first stage 220/420 and to ensure that the delay inverters 231/431 and 241/441 in the second and last stages operate safely in all process, voltage and temperature conditions. As mentioned above, for the disclosed pull-down pre-driver 300/500, the bias voltage 316/516 on the bias node 314/514 should be at some specific level within a range from VSS to approximately one-half VDD. This specific level should be sufficiently low to turn on the PFET power supply transistor 322/522 in the first stage 320/520 and to ensure that the delay inverters 331/531, 341/541 in the second and last stages operate safely in all process, voltage and temperature conditions.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A pre-driver circuit comprising:
   multiple stages comprising at least: a first stage; and a last stage; and
   a switching bias circuit comprising a bias voltage node electrically connected to each of the stages; a first switch; and a second switch,
   wherein the first switch and each of the stages receive an input signal,
   wherein, in response to the input signal transitioning from a first voltage level to a second voltage level, the first switch turns on the switching bias circuit so as to supply a bias voltage to each of the stages and the stages generate and output pre-driver signals, respectively, such that transitioning of the pre-driver signals from the second voltage level to the first voltage level occurs in sequence with a first pre-driver signal from the first stage transitioning first and a last pre-driver signal from the last stage transitioning last,
   wherein the second switch receives the last pre-driver signal, and
   wherein, in response to the last pre-driver signal transitioning from the second voltage level to the first voltage level, the second switch turns off the switching bias circuit.

2. The pre-driver circuit of claim 1,
   wherein each stage comprises: a power supply transistor; and a primary inverter that is connected to a drain region of the power supply transistor and that inverts the input signal when the power supply transistor turns on,
   wherein, in the first stage, a gate of the power supply transistor is connected to the bias voltage node,
   wherein all stages after the first stage further comprise a delay inverter connected between a voltage rail and the bias voltage node, and
   wherein an input to the delay inverter is a pre-driver signal from the primary inverter of a previous stage and an output of the delay inverter is applied to a gate of the power supply transistor.

3. The pre-driver circuit of claim 2, wherein, due to the bias voltage and outputs from each delay inverter, power supply transistors in the stages turn on in sequence such that the transitioning of the pre-driver signals from the second voltage level to the first voltage level occurs in sequence to reduce noise.

4. The pre-driver circuit of claim 3, wherein, due to the bias voltage and the outputs from each delay inverter, the transitioning of the pre-driver signals from the second voltage level to the first voltage level occurs at a slower rate than the transitioning of the input signal from the first voltage level to the second voltage level to reduce noise.

5. The pre-driver circuit of claim 1, wherein the switching bias circuit comprises a group of series-connected resistors connected at a first end by the first switch to a first voltage rail and connected at a second end by the second switch to a second voltage rail and wherein the bias voltage node is at a junction between adjacent resistors in the group.

6. The pre-driver circuit of claim 1, wherein the switching bias circuit comprises a group of series-connected transistors, wherein two transistors in the group comprise the first switch and the second switch, respectively, wherein all other transistors in the group comprise diode-connected transistors and wherein the bias voltage node is at a junction between adjacent transistors in the group.

7. The pre-driver circuit of claim 1, wherein the switching bias circuit further comprises: multiple resistors connected in series; multiple bias voltage nodes at junctions between adjacent transistors; and a multiplexor that selectively connects any one of the bias voltage nodes to the stages to tune delay and transition times of the pre-driver signals.

8. The pre-driver circuit of claim 1, further comprising a bypass circuit, wherein, during a bypass mode, the bypass circuit ensures that transitioning of the pre-driver signals from the second voltage level to the first voltage level occurs concurrently.

9. A pull-up pre-driver comprising:
   multiple stages comprising: a first stage; a second stage; and a last stage; and
   a switching bias circuit comprising: a group of n-type field effect transistors connected in series between a positive voltage rail and ground; and a bias voltage node at a junction between adjacent n-type field effect transistors in the group,
   wherein the bias voltage node is electrically connected to each of the stages, wherein one of the n-type field effect transistors in the group comprises a first switch, another of the n-type field effect transistors in the group comprises a second switch, and all others of the n-type field effect transistors in the group comprise diode-connected transistors, wherein the first switch and each of the stages receive an input signal, wherein, in response to the input signal transitioning from a low voltage level to a high voltage level, the first switch turns on the switching bias circuit so as to supply a bias voltage to each of the stages and the stages generate and output different pull-up pre-driver signals, respectively, such that transitioning of the pull-up pre-driver signals from the high voltage level to the low voltage level occurs in sequence with a first pull-up pre-driver signal from the first stage transitioning first and a last pull-up pre-driver signal from the last stage transitioning last, wherein the second switch receives the last pull-up pre-driver signal, and wherein, in response to the last pull-up pre-driver signal transitioning from the high voltage level to the low voltage level, the second switch turns off the switching bias circuit.

10. The pull-up pre-driver of claim 9, wherein the bias voltage is at a level within a range from a positive supply voltage level and approximately one-half the positive supply voltage level, wherein each stage comprises: an n-type power supply transistor; and a primary inverter that is connected to a drain region of the n-type power supply transistor and that inverts the input signal when the n-type power supply transistor turns on, wherein, in the first stage, a gate of the n-type power supply transistor is connected to the bias voltage node, wherein the second stage and the last stage further comprise a delay inverter that is connected between the bias voltage node and ground, wherein an input to the delay inverter is a pull-up pre-driver signal from the primary inverter of a previous stage and an output from the delay inverter is applied to the gate of the n-type power supply transistor, and wherein the first pull-up pre-driver signal is inverted with respect to the input signal and a second pull-up pre-driver signal from the second stage and the last pull-up pre-driver signal from the last stage are inverted and delayed with respect to the input signal.

11. The pull-up pre-driver of claim 10, wherein, due to the bias voltage and outputs from each delay inverter, n-type power supply transistors in the stages, respectively, turn on in sequence such that the transitioning of the pull-up pre-driver signals from the high voltage level to the low voltage level occurs in sequence to reduce noise.

12. The pull-up pre-driver of claim 11, wherein, due to the bias voltage and the outputs from each delay inverter, the transitioning of the pull-up pre-driver signals from the high voltage level to the low voltage level occurs at a slower rate than the transitioning of the input signal from the low voltage level to the high voltage level to reduce noise.

13. The pull-up pre-driver of claim 9, wherein the switching bias circuit further comprises: multiple bias voltage nodes at junctions between adjacent n-type field effect transistors, respectively; and a multiplexor that selectively connects any one of the bias voltage nodes to the stages to tune delay and transition times of the pull-up pre-driver signals.

14. The pull-up pre-driver of claim 9, further comprising a bypass circuit, wherein, during a bypass mode, the bypass circuit ensures that transitioning of the pull-up pre-driver signals from the high voltage level to the low voltage level occurs concurrently.

15. A pull-down pre-driver comprising:

multiple stages comprising: a first stage; a second stage; and a last stage; and a switching bias circuit comprising: a group of p-type field effect transistors connected in series between a positive voltage rail and ground; and a bias voltage node at a junction between adjacent p-type field effect transistors in the group, wherein the bias voltage node is electrically connected to each of the stages, wherein one of the p-type field effect transistors in the group comprises a first switch, another of the p-type field effect transistors in the group comprises a second switch, and all others of the p-type field effect transistors in the group comprise diode-connected transistors, wherein the first switch and each of the stages receive an input signal, wherein, in response to the input signal transitioning from a high voltage level to a low voltage level, the first switch turns on the switching bias circuit so as to supply a bias voltage to each of the stages and the stages generate and output different pull-down pre-driver signals, respectively, such that transitioning of the pull-down pre-driver signals from the low voltage level to the high voltage level occurs in sequence with a first pull-down pre-driver signal from the first stage transitioning first and a last pull-down pre-driver signal from the last stage transitioning last, wherein the second switch receives the last pull-down pre-driver signal, and wherein, in response to the last pull-down pre-driver signal transitioning from the low voltage level to the high voltage level, the second switch turns off the switching bias circuit.

16. The pull-down pre-driver of claim 15, wherein the bias voltage is at a level within a range from approximately one-half a positive supply voltage level and ground, wherein each stage comprises: an p-type power supply transistor; and a primary inverter that is connected to a drain region of the p-type power supply transistor and that inverts the input signal when the p-type power supply transistor turns on, wherein, in the first stage, a gate of the p-type power supply transistor is connected to the bias voltage node, wherein the second stage and the last stage further comprise a delay inverter that is connected between the positive voltage rail and ground, wherein an input to the delay inverter is a pull-down pre-driver signal from the primary inverter of a previous stage and an output from the delay inverter is applied to the gate of the p-type power supply transistor, and wherein the first pull-down pre-driver signal is inverted with respect to the input signal and a second pull-down pre-driver signal from the second stage and the last pull-down pre-driver signal from the last stage are inverted and delayed with respect to the input signal.

17. The pull-down pre-driver of claim 16, wherein, due to the bias voltage and outputs from each delay inverter, p-type power supply transistors in the stages, respectively, turn on in sequence such that the transitioning of the pull-down pre-driver signals from the low voltage level to the high voltage level occurs in sequence to reduce noise.

18. The pull-down pre-driver of claim 17, wherein, due to the bias voltage and the outputs from each delay inverter, the transitioning of the pull-down pre-driver signals from the low voltage level to the high voltage level occurs at a slower rate than the transitioning of the input signal from the high voltage level to the low voltage level to reduce noise.

19. The pull-down pre-driver of claim 15, wherein the switching bias circuit further comprises: multiple bias voltage nodes at junctions between adjacent p-type field effect transistors, respectively; and a multiplexor that selectively connects any one of the bias voltage nodes to the stages to tune delay and transition times of the pull-down pre-driver signals.

20. The pull-down pre-driver of claim 15, further comprising a bypass circuit, wherein, during a bypass mode, the bypass circuit ensures that transitioning of the pull-down pre-driver signals from the low voltage level to the high voltage level occurs concurrently.

* * * * *